United States Patent [19]
Borkowicz et al.

[11] Patent Number: 5,438,513
[45] Date of Patent: Aug. 1, 1995

[54] AUTOMOTIVE ELECTRONICS TEST SYSTEM

[75] Inventors: Neil L. Borkowicz, Plymouth; David S. Meir, Southfield, both of Mich.; John L. Evans, Madison; Robert W. Johnson, Auburn, both of Ala.

[73] Assignee: Chrysler Corporation, Highland Park, Mich.

[21] Appl. No.: 155,942

[22] Filed: Nov. 19, 1993

[51] Int. Cl.⁶ .............................................. G06F 15/20
[52] U.S. Cl. ................... 364/424.03; 364/431.04; 395/442; 395/497.01; 395/700
[58] Field of Search ............ 364/431, 424.03, 424.04, 364/579, 134; 395/425; 371/16.1

[56] References Cited

U.S. PATENT DOCUMENTS

| | | |
|---|---|---|
| 4,730,256 | 3/1988 | Niimi et al. . |
| 4,748,843 | 6/1988 | Schafer et al. . |
| 4,794,548 | 12/1988 | Lynch et al. . |
| 4,817,040 | 3/1989 | Bodley-Scott . |
| 4,817,118 | 3/1989 | Wilburn et al. . |
| 4,839,812 | 6/1989 | Nusser et al. . |
| 4,908,792 | 3/1990 | Przybyla et al. . |
| 4,987,541 | 1/1991 | Levente et al. . |
| 5,041,976 | 8/1991 | Marko et al. . |
| 5,075,853 | 12/1991 | Luke, Jr. ................ 364/424.02 |
| 5,113,344 | 5/1992 | Kellogg et al. . |
| 5,235,696 | 8/1993 | Schaff . |
| 5,239,470 | 8/1993 | Komatsu . |
| 5,270,943 | 12/1993 | Warn ..................... 364/479 |

Primary Examiner—Kevin J. Teska
Assistant Examiner—Susan Wieland
Attorney, Agent, or Firm—Wendell K. Fredericks

[57] ABSTRACT

A system and method for testing an automotive electronic microcontroller includes a multi-chip module comprised of a microcontroller chip and at least one memory chip. This multi-chip module is packaged in the same connection configuration a production single chip microcontroller urgently designed for the controller. The multi-chip module, thus, replaces the single chip module on the controller board itself and provides extra memory. A PC work station may be connected to the controller board via a reserved 8-pin interface. Once development and/or testing is complete, the multi-chip module is then replaced with the single chip module.

8 Claims, 2 Drawing Sheets

AUTOMOTIVE ELECTRONICS TEST SYSTEM

BACKGROUND OF THE INVENTION

The present invention relates to a development and test system for automotive electronics and, more particularly, to a system that provides extra memory for the development and testing of electronic controller modules in automobiles.

Software development for automotive electronics has become a critical task in all product designs. An example is illustrated in U.S. Pat. No. 4,748,843 of Schafer et al. Increased feature content and design complexity have made the evaluation of software programs difficult. Because of this complexity, additional memory is often required throughout the prototype development and evaluation phases of the program. Nowhere is this problem more evident than in the development of electronic modules for automotive applications.

Today, electronic modules are performing a variety of functions. These functions range from electronic instrumentation to basic functions, such as engine and transmission controllers, anti-skid braking systems and airbag modules. This increased emphasis on electronic feature content has made the development of support software very complex. To develop the software needed to operate these electronic modules, additional memory is often needed. The connection of additional memory in such an application is described in U.S. Pat. No. 5,247,446 of Motz et al.

One solution to this problem is to remove the microcontroller from the printed circuit board of the electronic module (mother board) and attach a daughter board comprised of a microcontroller and additional RAM. RAM is used for development and testing because it is easily overwritten. The additional RAM aids in the development of the application software code normally stored in ROM, thus the daughter board is generally referred to as a ROM-Aid board. The ROM-Aid board is additionally interfaced to a personal computer, i.e. PC-station, which can download Object Code to the memory on the ROM-Aid board. Additionally, the electronic module may receive commands from the PC-station.

This solution, however, presents several difficulties. Very often, space available on the mother board is limited and forces the ROM-Aid board to be attached separately. Also, the need for a separate ROM-Aid design board adds cost and assembly time while reducing reliability and complicating the debugging process.

Further, the interface between the main board and the ROM-Aid board is accomplished by either a flex circuit, e.g. a flexible ribbon connector, a special socket or pins. Although pins work in some applications, they are not suited for fine pitch components. Also, some testing involves actual driving of the vehicle and the resultant vibrations may cause the pin connections to fail. The socket design is not suitable for the in-vehicle environment. Soldering is not performed and the module cannot be potted. Therefore flex circuits (or flex strips) are used for in-vehicle calibration purposes.

The use of flex strips, i.e. a flex interconnect, to interface the two board assemblies is standard practice in ROM-Aid testing. The interface to the main board is made via the attachment of the flex strips to the solder pads of the microcontroller. The use of flex strips has been used successfully for a variety of ROM-Aid test modules. However, as the pitch of the microcontroller is reduced, interfacing the microcontroller to the flex interconnect becomes increasingly more difficult. For "fine pitch" components with a large number of pins, this interface is extremely tedious and difficult to work with. In the case of an engine controller, using the ROM-Aid board requires a 60 pin connector.

SUMMARY OF THE INVENTION

The present invention is directed to provide a stable connection between a controller board and a microprocessor and additional memory in a ROM-Aid module structure that duplicates the package outline of a microprocessor configuration on the controller board, but includes both the microprocessor and additional memory chips.

According to an illustrative embodiment of the present invention, laminate based Multi-Chip Module (MCM-L) technology is used to create a ROM-Aid board that comprises a microcontroller chip and at least one memory chip. This multi-chip module is packaged in the same package outline as a production single chip microcontroller for an engine controller mother board used for development and test purposes. The multi-chip module replaces the single chip module on the mother board itself and provides extra memory. Thus, the need for a daughter board connected via a flex strip is eliminated.

In the preferred embodiment, a PC station may be connected to the mother board via a reserved 8-pin interface. Once development and/or testing is complete, the multi-chip module is then replaced with the single chip module with the final program stored in ROM.

BRIEF DESCRIPTION OF THE DRAWINGS

The foregoing and other features of the present invention will be more readily apparent from the following detailed description of preferred embodiments taken in conjunction with the attached drawings wherein.

DETAILED DESCRIPTION OF THE PREFERRED EMBODIMENT

Figure 1:
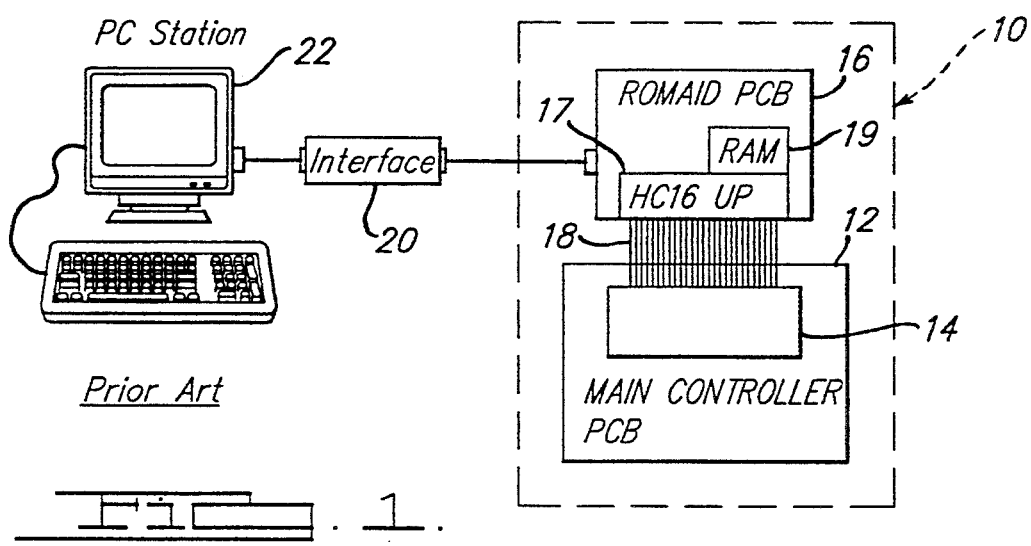
FIG. 1 is a diagrammatic view of the prior art ROM-Aid board as used in a development and test system.

FIG. 1 illustrates a prior art test and development system for an engine controller. The engine controller 10 includes a main controller printed circuit board or mother board 12. In operational form, board 12 includes a microcontroller and read-only memory (ROM), not shown, for controlling, for example, vehicle engine operation. During development, however, random access memory (RAM) must be provided to accept the newly created programs for testing. In order to accomplish this, the microcontroller is removed from the mother board leaving its pattern of solder pads 14. The use of flex strips to interface two board assemblies is standard practice to perform ROM-Aid testing. The ROM-Aid board 16 is interfaced to the mother board via the attachment of flex strips to the solder pads 14. If the solder pads 14 are finely spaced, this can be very time consuming. Also, the resulting structure can be relatively fragile.

The ROM-Aid itself includes a microcontroller 17, which takes the place of the microcontroller removed from the mother board, and additional RAM 19 that holds the new program and provides additional memory space for the test and development process.

The ROM-Aid 16 is connected via a cable interface 20 to a computer work station, i.e., PC-station 22, which inputs the new program under test, which could be in object or source code, to the controller 10 through ROM-Aid 16. The PC-station may also command the microcontroller through the interface to begin execution of the program.

Figure 2:
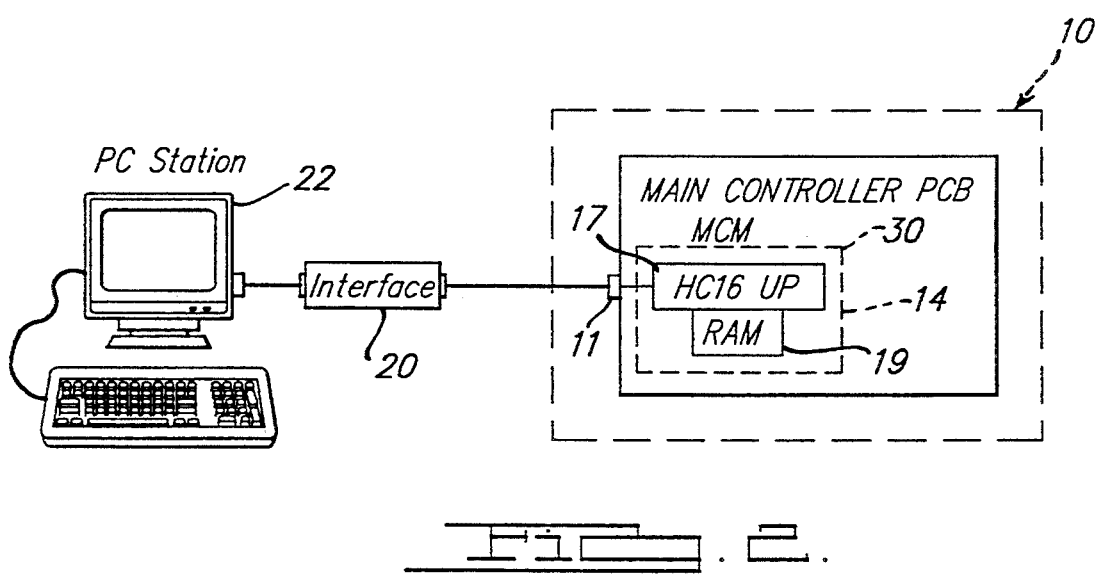
FIG. 2 is a diagrammatic view of the multi-chip module as used in a development and test system.

The purpose of the present invention is to eliminate the flexible cable 18 while still providing the benefits of a ROM-Aid. This is accomplished as shown in FIG. 2, which illustrates the novel test and development system of the present invention. A multiple layer laminate based L type Multi-Chip Module board 30 is packaged into the same package outline as the solder pads 14 of the original single chip microcontroller module. In use the original microcontroller is removed and the new MCM ROM-Aid module 30 is electrically connected to the solder pads 14 to the solder pads 14 in its place. The RAM internal to the multi-chip module 30 may require battery power. Such power may be provided via a small daughter board (not shown) having a battery attached to the mother board through a minimal number of leads.

Additionally, the interface 20 is now connected from the PC-station 22 to the mother board via an eight-pin connection 11 reserved on the mother board. Through the interface, the PC-station may down load program code and command the microcontroller in the same manner as the prior art ROM-Aid board configuration.

Figure 3:
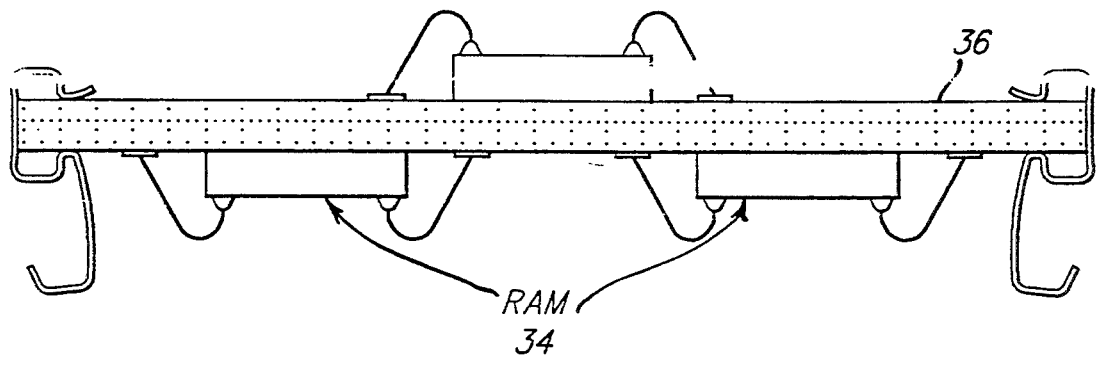
FIG. 3 is a cross-sectional view of the multi-chip module of the present invention.

FIG. 3 illustrates a cross section of the preferred embodiment of a MCM ROM-aid module 30. It is comprised of a microcontroller chip 32 on the top and two RAM chips 34 on the bottom. FIG. 3 also shows the multiple layer laminated board 36, upon which the microcontroller and RAM are mounted on the top and bottom surfaces.

Figure 4:
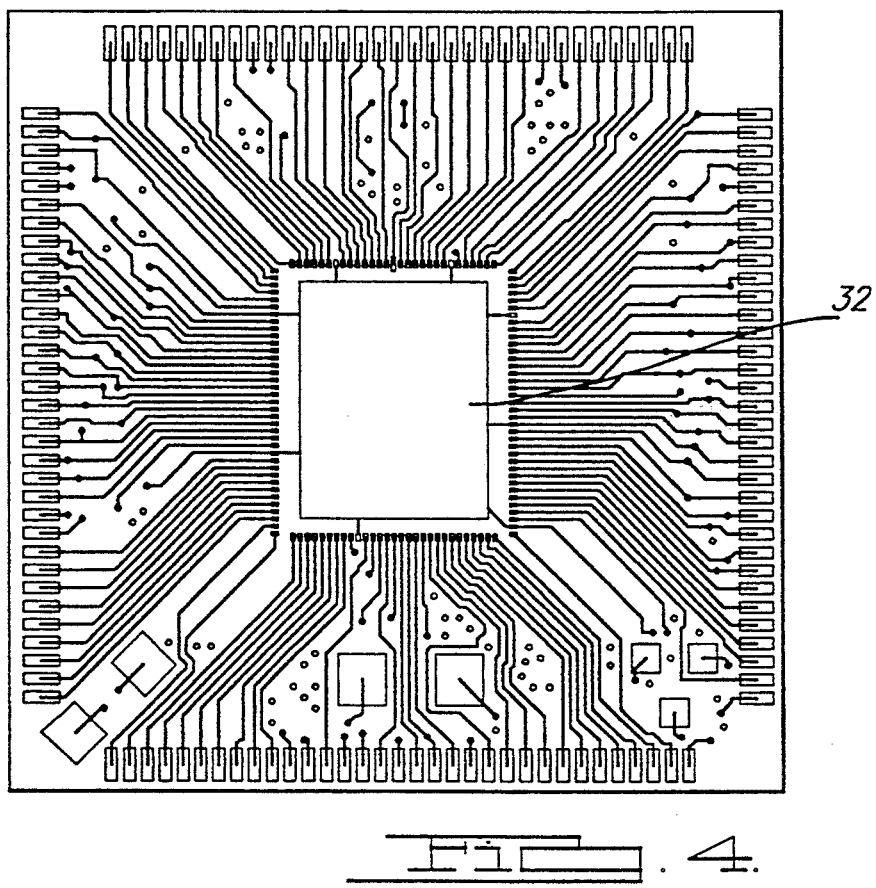
FIG. 4 is the layout of the top of the multi-chip module.
Figure 5:
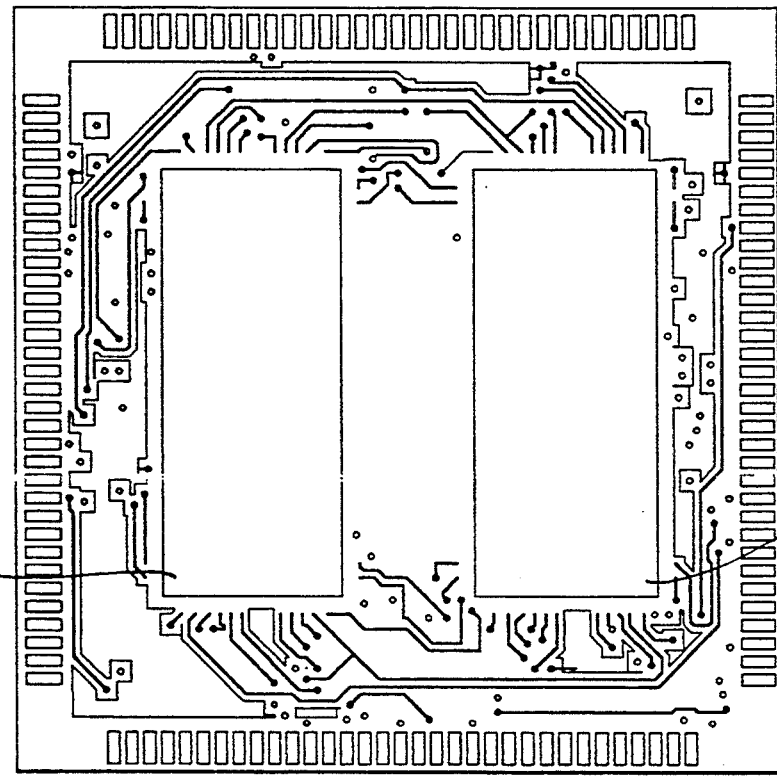
FIG. 5 is the layout of the bottom of the multi-chip module.

FIGS. 4 and 5 illustrate the top and bottom views, respectively, of the layout of the preferred embodiment of the multi-chip module 30 to be used to develop and test an engine controller module. The engine controller module 10 (FIGS. 1 and 2) uses a Motorola 68HC16Z2 microcontroller packaged in a 0.025" pitch 132 lead plastic gull wing package. This is the unit that is removed to make way for the ROM-Aid 16. The multi-chip module 30 also comprises a Motorola 68HC16Z2 microcontroller 32, but additionally includes two Hitachi 128k×8 RAM chips 34 packaged in a 0.025" pitch 132 lead package (FIGS. 4 and 5).

To meet the space requirements it was necessary to design the MCM with the microcontroller (0.237"×0.302"), resistors (1206 chips, not shown) and a MOSFET (SOT-23, not shown) on the topside and the two RAM chips (0.567"×0.224") on the bottom side of the substrate as illustrated in FIGS. 3-5. The MCM substrate was 1.06"×1.06". Placement of components on both sides restricted the placement of vias in the laminated circuit board 36. The MCM substrate 36 contained six layers—4 signal and power and ground. A ground fill was used on all signal layers. The design used 5 mil lines and 5 mil spaces and 8 mil drill vias.

The MCM-L substrate was fabricated with ½ oz. copper and the laminate material was Polyclad PCL-511. PCL-511 is based on SYCAR TM, a thermosetting silicon-carbon resins developed by Hercules, Inc. Thermosonic gold wire bonding may be used in the assembly of the MCM and the Polyclad 511 with a Tg of 190° C. is compatible with a wire bond stage temperature of 150° C. Other properties of the PCL-511 include a dielectric constant of 3.46 at 1 MHz (50% resin content and E-glass), and 0.02% water absorption after 24 hours in boiling water. The outer layers were pattern electroplated with nickel and gold for wire bonding and the copper was etched.

MCM assembly began with the attachment of the 0.025" pitch lead frames (Die-Tech, Inc. P/N LF-5207-04-510). Early evaluation of the mechanical integrity of the chip leads soldered to substrate edge pads (0.015"×0.045") revealed the potential for peeling of the copper pads from the substrate surface, particularly, if the chip leads were not soldered to pads on both sides of the substrate. To provide for the mechanical integrity of the leads, a bead of epoxy (Ciba Geigy, Epi-Bond 7200) was dispensed along the substrate edge over the lead frames and cured at 150° C. for 20 minutes. After the lead frames were attached and the epoxy cured, solder paste was dispensed onto the ends of the substrate edge pads. In addition, solder was dispensed for the chip resistors and MOSFET, which were then placed. The assembly was reflowed and cleaned.

The microcontroller die was attached with Ablebond 84-ILMI silver filled epoxy and cured for ½ hour at 150° C. The die was then wire bonded with 1.25 mil gold wire using a K&S 1419 automatic thermosonic wire bonder. Next, the RAM die were attached with silver epoxy, cured and wire bonded. For encapsulation, a dam was formed around the individual die by dispensing a bead of Epi-Bond 7200 and curing for 20 minutes at 150° C. Modules were encapsulated either with a clear elastomeric material (Dow Corning R-6101) to allow visual inspection of the die and wire bond connections, or with SYCAR TM Liquid Encapsulant from Hercules, Inc. The medium flow version of the material was cured at 120° C. for 1 hour then at 150° C. for 2 hours.

The MCM was surface mount attached to the solder pads 14 of controller printed wiring board for testing and use.

While the invention has been particularly shown and described with reference to preferred embodiments thereof, it will be understood by those skilled in the art that various changes in form and details may be made therein without departing from the spirit and scope of the invention.

What is claimed is:

1. An Apparatus for adding additional memory to an electronic controller having a printed circuit board designed with at least a first removable microcontrol means having memory available to it for controlling at least one functional system, said first removable microcontrol means being mountable on the printed board by a connection means having a particular configuration, comprising:

a module board having a module attachment means for attaching said module board to said connection means, said attachment means having a configuration that corresponds to the particular configuration of the connection means for the first removable microcontrol means;

at least a second microcontrol means for controlling at least one functional system, said second microcontrol means being mounted on said module board; and at least one memory means for storing at least digital code and being mounted on said module board, said memory means being available for use by said second microcontrol means and having more memory space than the memory of said first removable microcontrol means, whereby said module board, said second microcontrol means and said memory means form a multi-chip module connectable directly to the connection means for the first removable microcontrol means and providing additional memory to said second microcontrol means so that said second microcontrol means has more memory available than was available to said first removable microcontrol means.

2. An apparatus according to claim 1, wherein said electronic controller is an automotive electronic controller module.

3. An apparatus according to claim 1, wherein said printed circuit board further comprises a further connection means;
an interface electrically connected to said connection means; and
a data processor electrically connected to said interface.

4. An apparatus according to claim 3, wherein said data processor comprises downloading means for downloading object code to said memory means.

5. Apparatus according to claim 3, wherein said data processor comprises communication means for commanding said second microcontrol means to execute software code.

6. A test and development system for a motor vehicle electronic module having a printed circuit board, said printed circuit board having a first removable microcontrol means having memory available to it for controlling at least one functional system of said motor vehicle, said first removable microcontrol means being connected to said printed circuit board by connection means having a particular configuration, comprising:
a module board having a module attachment means for attaching said module board to said connection means, said attachment means having a configuration that corresponds to the particular configuration of the connection means for the first removable microcontrol means;
at least a second microcontrol means for controlling at least one functional system, said second microcontrol means being mounted on said module board; and
at least one memory means for storing at least digital code and being mounted on said module board, said memory means being available for use by said second microcontrol means and having more memory space than the memory of said first removable microcontrol means, whereby said module board, said second microcontrol means and said memory means form a multi-chip module connectable directly to the connection means for the first removable microcontrol means and providing additional memory to said second microcontrol means so that said second microcontrol means has more memory available than was available to said first removable microcontrol means.

7. A test and development method for a motor vehicle electronic module having a printed circuit board, said printed circuit board having a first removable microcontrol means having memory available to it for controlling at least one functional system of said motor vehicle, said first removable microcontrol means being connectable to said printed circuit board by a first connection means having a particular connection configuration, said test and development method comprising the steps of:
removing said first removable microcontrol means;
electronically connecting a multi-chip module in place of said first removable microcontrol means, said multi-chip module comprising at least one second microcontrol means for controlling at least one functional system in said motor vehicle and at least one memory means for storing at least one of data and software code, said memory means being available for use by said second microcontrol means and having more memory space than the memory of said first removable microcontrol means so that said second microcontrol means has more memory available than was available to said first removable microcontrol means, said multi-chip module having a second connection means for connection to said printed circuit board, said first and second connection means having the same connection configuration;
controlling said second microcontrol means to begin controlling said functional system; and
monitoring said second microcontrol means while it is controlling.

8. A test and development method according to claim 7, further comprises the steps of:
connecting one end of a data processing interface to said printed circuit board;
electrically connecting a data processor to the other end of said data processing interface;
downloading object code from the data processor to the first memory means;
controlling said second microcontrol means to begin executing said object code; and
monitoring said execution of said object code.

* * * * *